(12) United States Patent
Yamakoshi

(10) Patent No.: US 9,472,289 B2
(45) Date of Patent: Oct. 18, 2016

(54) SEMICONDUCTOR DEVICE

(71) Applicant: Renesas Electronics Corporation, Tokyo (JP)

(72) Inventor: Hideaki Yamakoshi, Tokyo (JP)

(73) Assignee: Renesas Electronics Corporation, Tokyo (JP)

(*) Notice: Subject to any disclaimer, the term of this patent is extended or adjusted under 35 U.S.C. 154(b) by 0 days.

(21) Appl. No.: 15/001,361

(22) Filed: Jan. 20, 2016

(65) Prior Publication Data

US 2016/0232977 A1   Aug. 11, 2016

(30) Foreign Application Priority Data

Feb. 5, 2015   (JP) .................................. 2015-021177

(51) Int. Cl.
| | |
|---|---|
| G11C 16/04 | (2006.01) |
| G11C 16/10 | (2006.01) |
| H01L 27/115 | (2006.01) |
| G11C 16/26 | (2006.01) |
| G11C 16/14 | (2006.01) |
| H01L 27/02 | (2006.01) |
| H01L 29/788 | (2006.01) |

(52) U.S. Cl.
CPC .............. *G11C 16/10* (2013.01); *G11C 16/14* (2013.01); *G11C 16/26* (2013.01); *H01L 27/0207* (2013.01); *H01L 27/11524* (2013.01); *H01L 27/11526* (2013.01); *H01L 29/7883* (2013.01)

(58) Field of Classification Search
USPC .............. 365/185.05; 257/315, 295, 296, 321
See application file for complete search history.

(56) References Cited

U.S. PATENT DOCUMENTS

| | | | | |
|---|---|---|---|---|
| 6,483,136 B1 * | 11/2002 | Yoshida | ............ | H01L 27/10817 257/295 |
| 7,839,683 B2 | 11/2010 | Oka et al. | | |
| 2010/0032741 A1 * | 2/2010 | Ueno | ................ | H01L 21/28273 257/298 |

FOREIGN PATENT DOCUMENTS

JP              5265898 B2     8/2013

* cited by examiner

*Primary Examiner* — Vu Le
(74) *Attorney, Agent, or Firm* — Sughrue Mion, PLLC

(57) ABSTRACT

In order to reduce a chip area of a semiconductor device having a non-volatile memory, a configuration is adopted, in which a length in a second direction of a capacity electrode of an element for writing/erasing data is made smaller than both a length in the second direction of a gate electrode of an element for reading data formed by part of the same floating electrode and a length in the second direction of a capacity electrode of a capacitive element. Herein, by recessing, of the side surfaces of the capacity electrode of the element for writing/erasing data, the side surface on the side opposite to the capacity electrode of the other element for writing/erasing data adjacent to the former element for writing/erasing data, a length in the second direction of an active region where the element for writing/erasing data is arranged is reduced.

9 Claims, 13 Drawing Sheets

SEMICONDUCTOR DEVICE

CROSS-REFERENCE TO RELATED APPLICATIONS

The disclosure of Japanese Patent Application No. 2015-021177 filed on Feb. 5, 2015 including the specification, drawings and abstract is incorporated herein by reference in its entirety.

BACKGROUND

The present invention relates to a semiconductor device, and can be preferably used in a semiconductor device having, for example, a built-in non-volatile memory.

Japanese Patent Publication No. 5265898 (Patent Document 1) describes a semiconductor device including a first non-volatile memory cell and a second non-volatile memory cell that are arranged adjacent to each other. A capacitive element of the first non-volatile memory cell is formed in a first active region, and both a read-out element of the first non-volatile memory cell and that of the second non-volatile memory cell are formed in a third active region. Additionally, both a writing/erasing element of the first non-volatile memory cell and that of the second non-volatile memory cell are formed in a second active region. Additionally, a capacitive element of the second non-volatile memory cell is formed in a fourth active region.

RELATED ART DOCUMENT

Patent Document

[Patent Document 1] Japanese Patent Publication No. 5265898

SUMMARY

Although there is a demand for OTP (One Time Programmable) non-volatile memory cells in which, for example, "0" data or "1" data can be written only once, there are applications demanding MTP (Multi Time Programmable) non-volatile memory cells in which data can be rewritten multiple times. With the progress of process generations, there is an increasing demand for a reduction in the chip area of a semiconductor device; however, in the MTP non-volatile memory cell, it has been made clear from the study by the present inventors that it is difficult to reduce a cell size.

Other problems and new characteristics will become clear from the description and accompanying drawings of the present specification.

A semiconductor memory according to one embodiment is provided with: a first non-volatile memory cell including a first element for writing/erasing data, a first element for reading data, and a first capacitive element; and a second non-volatile memory cell including a second element for writing/erasing data, a second element for reading data, and a second capacitive element. The first capacitive element is formed in a first active region, the first element for writing/erasing data and the second element for writing/erasing data are formed in a second active region, the first element for reading data and the second element for reading data are formed in a third active region, and the second capacitive element is formed in a fourth active region. The first non-volatile memory cell has a first floating electrode arranged to extend in a first direction so as to planarly overlap the first active region, the second active region, and the third active region; and the second non-volatile memory cell has a second floating electrode arranged to extend in the first direction so as to planarly overlap the second active region, the third active region, and the fourth active region. In the first non-volatile memory cell, a length in a second direction of the first floating electrode that planarly overlaps the second active region, the second direction intersecting with the first direction at right angles, is smaller than a length in the second direction of the first floating electrode that planarly overlaps the third active region. In the second non-volatile memory cell, a length in the second direction of the second floating electrode that planarly overlaps the second active region is smaller than a length in the second direction of the second floating electrode that planarly overlaps the third active region.

According to one embodiment, the chip area of a semiconductor device having a non-volatile memory can be reduced.

DETAILED DESCRIPTION

Figure 1:
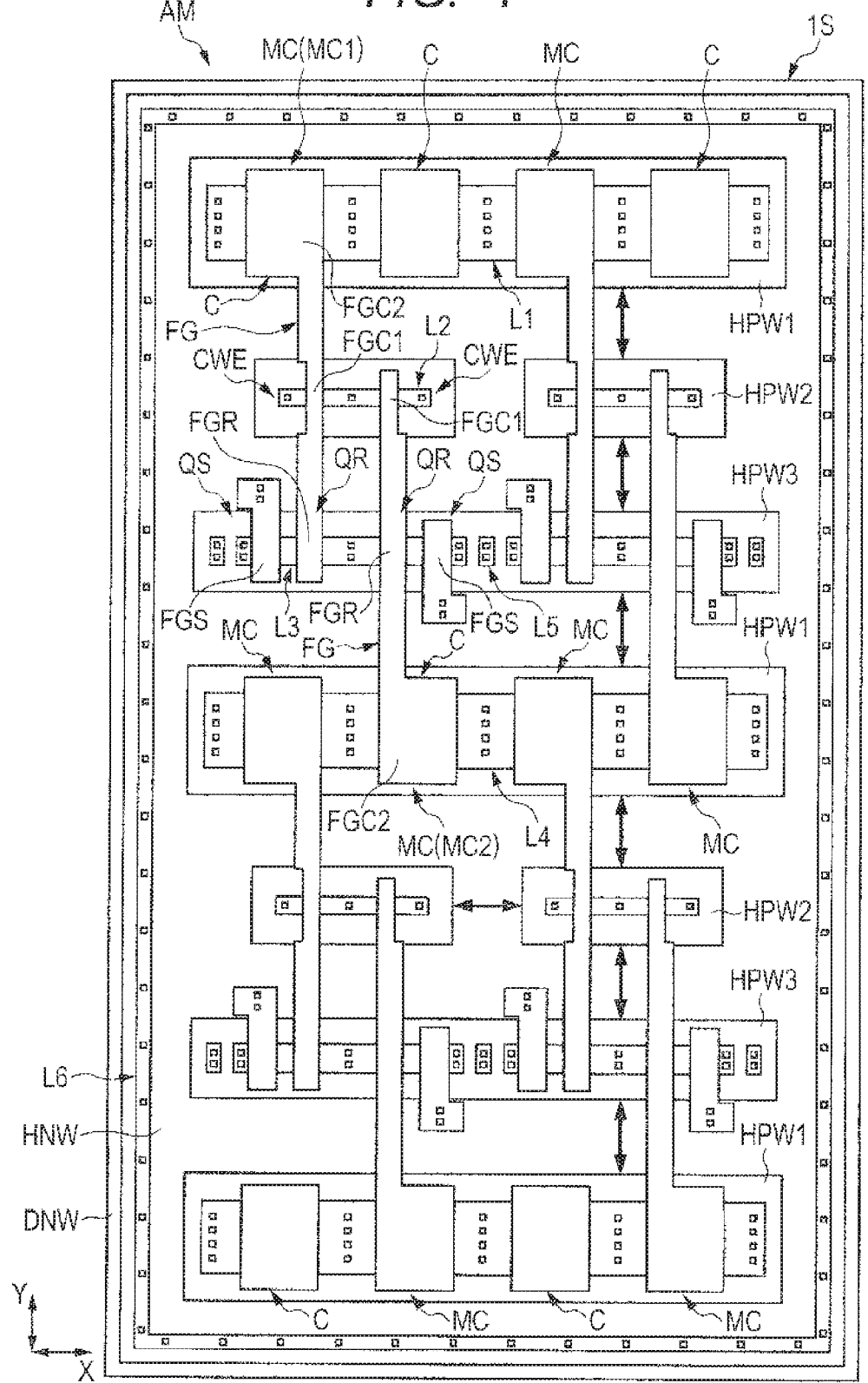
FIG. 1 is an essential-part plan view of a non-volatile memory (in the case of 8 bits) arranged in a non-volatile memory region according to First Embodiment of the present invention.

In the following embodiments, when necessary for convenience, description is given by dividing the embodiment into a plurality of sections or embodiments, however, unless explicitly stated, they are not independent of one another, but one is related with the other part or the whole as a modification example, a detail, supplementary description, etc.

In addition, in the following embodiments, when referred to the number of elements, etc. (number of units, numerical value, quantity, range, etc., are included), unless stated explicitly or except when the number is obviously limited to specific numbers in principle, the number is not limited to the specific ones but may be more or less than the specific numbers. Further, in the following embodiments, it is needless to say that components (also including constituent steps, etc.) are not necessarily requisite unless stated explicitly or except when they are obviously requisite in principle. Similarly, when the shapes and positional relations, etc., of the constituents, etc., are referred to in the following embodiments, those substantially the same or similar to the shapes, etc., should also be included, unless otherwise indicated or except when considered to be clearly otherwise in principle. This also applies to the aforementioned numerical values and ranges.

In the drawings used in the following embodiments, hatching may be added even to plan views in order to make them easier to see. In addition, like components are denoted with like reference numerals in principle in each of the views for explaining the embodiments, and duplicative explanations are omitted. Hereinafter, preferred embodiments of the present invention will be described in detail based on the accompanying drawings.

(First Embodiment)
<<Structure of Non-volatile Memory>>

In a semiconductor device according to First Embodiment, a main circuit and a non-volatile memory for storing relatively small and desired data (information) on the main circuit are formed in each of a main circuit region and a non-volatile memory region that are arranged in the same semiconductor chip. A semiconductor substrate that forms the semiconductor chip (hereinafter, referred to as a "substrate") has both a main surface (element forming surface) in which the main circuit and the non-volatile memory are formed and a rear surface opposite thereto. Hereinafter, a semiconductor device (LCD (Liquid Crystal Device) driver) will be described, in which a non-volatile memory for storing desired information on a main circuit is formed in a semiconductor chip where an LCD driver circuit is formed as the main circuit. Herein, the LCD driver described in First Embodiment means a semiconductor device for driving or controlling a display panel, such as a liquid crystal display panel.

Figure 2:
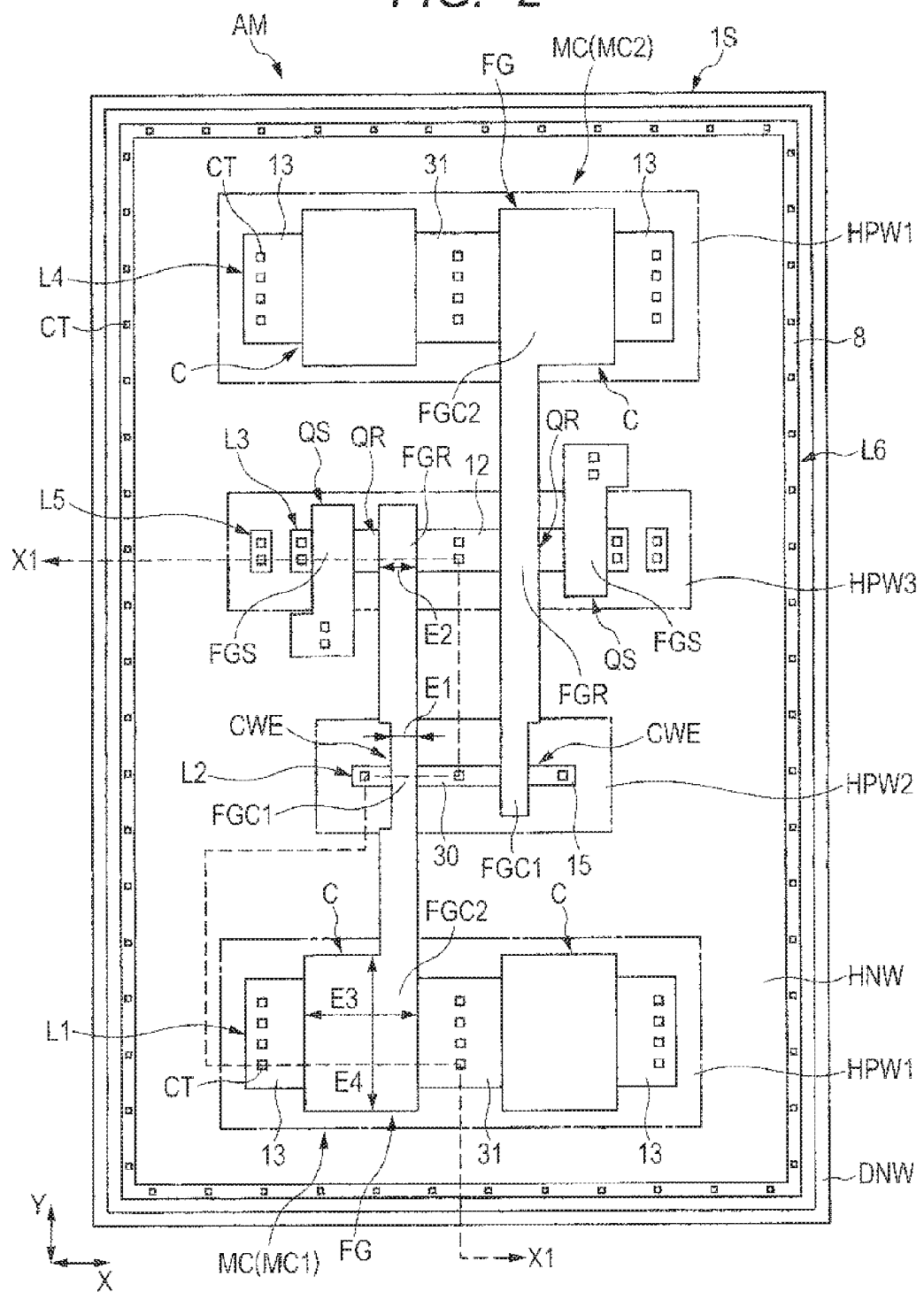
FIG. 2 is an essential-part plan view of a non-volatile memory (in the case of 2 bits) arranged in the non-volatile memory region according to First Embodiment of the invention.
Figure 3:
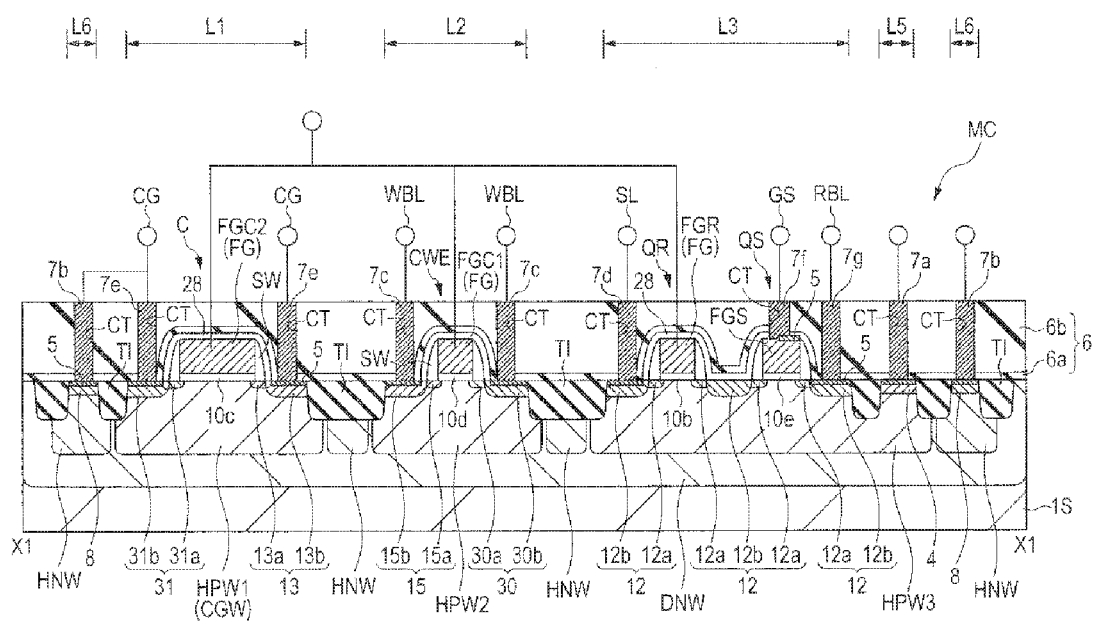
FIG. 3 is an essential-part sectional view of a non-volatile memory cell (section taken along X1-X1 Line in FIG. 2) in a semiconductor device according to First Embodiment of the invention.

FIGS. 1 and 2 are essential-part plan views of a non-volatile memory arranged in a non-volatile memory region AM according to First Embodiment, which illustrate the cases of 8 bits and 2 bits, respectively. FIG. 3 is an essential-part sectional view of a non-volatile memory cell in the semiconductor device according to First Embodiment, which representatively illustrates a section taken along X1-X1 Line in FIG. 2. In FIGS. 1 and 2, part of an insulating layer, etc., formed to cover, for example, the non-volatile memory cell is omitted in order to easily understand the arrangement of the non-volatile memory cell.

As illustrated in FIGS. 1 and 2, the non-volatile memory according to First Embodiment includes a plurality of non-volatile memory cells (hereinafter, referred to as "memory cells") MC formed by an element CWE for writing/erasing data, an element QR for reading data, and a capacitive element C, which are formed in a main surface of a substrate 1S. These memory cells MC are to be arranged at positions where bit lines (arranged in a first direction Y in the views) and word lines (arranged in a second direction X in the views), which are arranged in a matrix pattern, intersect with each other.

The memory cells MC formed in the main surface of the substrate 1S includes memory cells MC1 and memory cells MC2 that are arranged adjacent to each other. Additionally, active regions L1, L2, L3, L4, L5, and L6, which are electrically isolated from each other, are arranged in the main surface of the substrate 1S. Herein, the active region is a region where an element contributing to operations of the non-volatile memory cell is mainly formed, and is a region divided by an element isolation region (isolation part).

In these active regions L1 and L2, the capacitive element C of the memory cell MC1 is formed in the active region L1, while both the element CWE for writing/erasing data of the memory cell MC1 and the element CWE for writing/erasing date of the memory cell MC2 are formed in the active region L2. In these active regions L3 and L4, both the element QR for reading data of the memory cell MC1 and the element QR for reading data of the memory cell MC2 are formed in the active region. L3, while the capacitive element C of the memory cell MC2 is formed in the active region L4.

In the semiconductor device according to First Embodiment, the elements CWE for writing/erasing data of the respective memory cells MC1 and MC2 are formed in the common active region L2, and the elements QR for reading data of the respective memory cells MC1 and MC2 are formed in the common active region L3, as described above, and hence a chip area can be reduced.

In First Embodiment, the non-volatile memory for storing desired information on a main circuit is formed in a semiconductor chip where an LCD driver circuit is formed as the main circuit. The desired information include, for example: information on the arrangement address of an effective (use) element to be used in trimming the inside of the semiconductor chip; information on the arrangement address of an effective memory cell (memory cell having no defect) or an effective LCD element to be used in relieving the non-volatile memory or the LCD; trimming tap information on an adjustment voltage to be used in adjusting an LCD image; the serial number of the semiconductor device; and the like. As these desired information are increased, the amount of information (the number of memory cells) of the non-volatile memory is increased. Even when the number of memory cells is thus increased, an increase in the chip area can be suppressed by arranging the memory cells as illustrated in First Embodiment.

Hereinafter, the configuration of the memory cell MC according to First Embodiment will be specifically described with reference to the memory cell MC1 in FIGS. 2 and 3. The memory cell MC illustrated in FIG. 1 also has the same configuration.

An isolation part TI having a trench shape, by which the active regions L1, L2, L3, L4, L5, and L6 are defined, is formed in the main surface of the p-type substrate 1S. In an n-type (first conductivity type) embedded well DNW formed in the substrate 1S, p-type (second conductivity type) wells HPW1, HPW2, and HPW3 and an n-type well HNW are formed. The p-type wells HPW1, HPW2, and HPW3 are contained in the embedded well DNW in a state where they are electrically isolated from each other by the embedded well DNW and the n-type well HNW.

The p-type wells HPW1, HPW2, and HPW3 contain impurities that exhibit p-type conductivity, such as, for example, boron (B). A p$^+$-type semiconductor region 4 is formed in part of the upper layer of the p-type well HPW3. The p$^+$-type semiconductor region 4 contains the same impurities as those of the p-type well HPW3, but the impurity concentration of the p$^+$-type semiconductor region 4 is set to be higher than that of the p-type well HPW3. The p$^+$-type semiconductor region 4 is electrically coupled to a conductor part 7a in a contact hole CT formed in an insulating layer 6 over the main surface of the substrate 1S. A silicide layer 5 may be formed in part of the surface layer of the p$^+$-type semiconductor region 4 that the conductor part 7a contacts.

The n-type well HNW contains impurities that exhibit n-type conductivity, such as, for example, phosphorus (P) or arsenic (As). An n$^+$-type semiconductor region 8 is formed in part of the upper layer of the n-type well HNW. The n$^+$-type semiconductor region 8 contains the same impurities as those of the n-type well HNW, but the impurity concentration of the n$^+$-type semiconductor region 8 is set to be higher than that of the n-type well HNW. The n$^+$-type semiconductor region 8 is away from the p-type wells HPW1, HPW2, and HPW3 so as not to contact them. That is, part of the n-type embedded well DNW is interposed between the n$^+$-type semiconductor region 8 and each of the p-type wells HPW1, HPW2 and HPW3. The n$^+$-type semiconductor region 8 is electrically coupled to a conductor part 7b in the contact hole CT formed in the insulating layer 6 over the main surface of the substrate 1S. The silicide layer 5 may be formed in part of the surface layer of the n$^+$-type semiconductor region 8 that the conductor part 7b contacts. The insulating layer 6 includes a laminated film in which an insulating layer 6a including, for example, silicon nitride and an insulating layer 6b including, for example, silicon oxide are sequentially deposited.

The memory cell MC according to First Embodiment has a floating electrode FG, the element CWE for writing/erasing data, the element QR for reading data, and the capacitive element C.

The floating electrode FG is a part for accumulating charges to be used for storing data. The floating electrode FG includes a conductor film, such as, for example, low-resistance polycrystalline silicon, and is formed in an electrically floating state (state of being insulated from other conductors). Additionally, the floating electrode FG is formed in a state of extending along the first direction Y so as to planarly overlap the p-type wells HPW1, HPW2, and HPW3 that are adjacent to each other, as illustrated in FIG. 2.

The element CWE for writing/erasing data, which is a capacitive element for writing/erasing data, is arranged at a first position where the floating electrode FG planarly overlaps the active region L2 of the p-type well HPW2. The element CWE for writing/erasing data has a capacity electrode FGC1, a capacitive insulating film 10d, a p-type semiconductor region 15, an n-type semiconductor region 30, and the p-type well HPW2.

The capacity electrode FGC1, formed by part of the floating electrodes FG, is a part that forms one electrode of the element CWE for writing/erasing data. Herein, a length E1 in the second direction X of the capacity electrode FGC1 is formed to be smaller than both a length E2 in the second direction X of a gate electrode FGR of the element QR for reading data formed by part of the same floating electrode FG, and a length E3 in the second direction X of a capacity electrode FGC2 of the capacitive element C.

The capacitive insulating film 10d includes, for example, silicon oxide, and is formed between the capacity electrode FGC1 and the substrate 1S (p-type well HPW2). The thickness of the capacitive insulating film 10d is, for example, 7 nm or more and 20 nm or less. In the element CWE for writing/erasing data according to First Embodiment, however, an electron is injected into the capacity electrode FGC1 from the p-type well HPW2 via the capacitive insulating film 10d, and an electron in the capacity electrode FGC1 is discharged into the p-type well HPW2 via the capacitive insulating film 10d, in rewriting data; and hence the thickness of the capacitive insulating film 10d is set to be small, and specifically set to be for example, approximately 12 nm. The thickness of the capacitive insulating film 10d should be 7 nm or more, because the reliability of the capacitive insulating film 10d cannot be secured if the thickness thereof is smaller than that. The thickness of the capacitive insulating film 10d should be 20 nm or less, because it becomes difficult to make an electron and a hole pass therethrough, and hence data cannot be rewritten sufficiently.

A pair of the p-type semiconductor regions 15 and the n-type semiconductor regions 30 of the element CWE for writing/erasing data are formed, in the p-type well HPW2 and at positions by which the capacity electrode FGC1 is sandwiched, self-alignedly with respect to the capacity electrode FGC1. The p-type semiconductor region 15, the n-type semiconductor region 30, and the p-type well HPW2 are parts that form one electrode of the element CWE for writing/erasing data. That is, in the element CWE for writing/erasing data, the conductivity types of the semiconductor regions on both the sides of the capacity electrode FGC1 are asymmetric to each other. With such a configuration, a depletion layer can be suppressed or prevented from being formed in the substrate 1S when data are erased or written.

The p-type semiconductor region 15 has both a p$^-$-type semiconductor region 15a located near to a channel and a p$^+$-type semiconductor region 15b electrically coupled to the p$^-$-type semiconductor region 15a. The p$^-$-type semiconductor region 15a and the p$^+$-type semiconductor region 15b contain impurities of the same conductivity type, such as, for example, boron (B), but the impurity concentration of the p$^+$-type semiconductor region 15b is set to be higher than that of the p$^-$-type semiconductor region 15a. The p-type semiconductor region 15 is electrically coupled to the p-type well HPW2.

The n-type semiconductor region 30 has both an n$^-$-type semiconductor region 30a located near to a channel and an n$^+$-type semiconductor region 30b electrically coupled to the n$^-$type semiconductor region 30a. The n$^-$n-type semiconductor region 30a and the n$^+$-type semiconductor region 30 contain impurities of the same conductivity type, such as, for example, phosphorus (P) or arsenic (As), but the impurity concentration of the n$^+$-type semiconductor region 30b is set to be higher than that of the n$^-$-type semiconductor region 30a.

The p$^-$-type semiconductor region 15a and the n$^-$-type semiconductor region 30a are terminated after extending by a distance of approximately the width of a sidewall SW from around one end of the capacity electrode FGC1 along the main surface of the substrate 1S. The p$^+$-type semiconductor region 15b and the n$^+$-type semiconductor region 30b partially overlap the p$^-$-type semiconductor region 15a and the n$^-$-type semiconductor region 30a at the terminations thereof, respectively, and are terminated at the isolation part TI after extending by desired lengths from the overlap positions along the main surface of the substrate 1S.

In First Embodiment, the n-type semiconductor region 30 is formed between the two floating electrodes FG adjacent to each other, as illustrated in FIG. 2. That is, the n-type semiconductor region 30 serves as a common region between the two elements CWE for writing/erasing data.

The p-type semiconductor region 15 and the n-type semiconductor region 30 are electrically coupled to conductor parts 7c in the contact holes CT formed in the insulating layer 6 over the main surface of the substrate 1S. The conductor part 7c is electrically coupled to a bit line WBL for writing/erasing data. The silicide layer 5 may be formed in part of the surface layer of each of the p$^+$-type semiconductor region 15b and the n$^+$-type semiconductor region 30b that the conductor part 7c contacts.

The element QR for reading data is arranged at a second position where the floating electrode FG planarly overlaps the active region L3 of the p-type well HPW3. The element QR for reading data has the gate electrode FGR, a gate insulating film 10b, and a pair of n-type semiconductor regions 12 and 12. A channel of the element QR for reading data is formed in the upper layer of the p-type well HPW3 where the gate electrode FGR and the active region L3 planarly overlap each other.

The gate electrode FGR is formed by part of the floating electrode FG. The length E2 in the second direction X of the gate electrode FGR is determined by the operating characteristic of the element QR for reading data, and is formed to be larger than the length E1 in the second direction X of the capacity electrode FGC1 of the element CWE for writing/erasing data formed by part of the same floating electrodes FG.

The gate insulating film 10b includes, for example, silicon oxide, and is formed between the gate electrode FGR and the substrate 1S (p-type well HPW3). The thickness of the gate insulating film 10b is, for example, approximately 12 nm.

The pair of the n-type semiconductor regions 12 and 12 of the element QR for reading data are formed, in the p-type well HPW3 and at positions by which the gate electrode FGR is sandwiched, self-alignedly with respect to the gate electrode FGR. Each of the pair of the n-type semiconductor regions 12 and 12 of the element QR for reading data has both an n$^-$-type semiconductor region 12a located near to the channel and an n$^+$-type semiconductor region 12b coupled to the n$^-$-type semiconductor region 12a. The n$^-$-type semiconductor region 12a and the n$^+$-type semiconductor region 12b contain impurities of the same conductivity type, such as, for example, phosphorus (P) or arsenic (As), but the impurity concentration of the n$^+$-type semiconductor region 12b is set to be higher than that of the n$^-$-type semiconductor region 12a.

One of the n-type semiconductor regions 12 and 12 of such an element QR for reading data is electrically coupled to a conductor part 7d in the contact hole CT formed in the insulating layer 6 over the main surface of the substrate 1S. The conductor part 7d is electrically coupled to a source line SL. The silicide layer 5 may be formed in part of the surface layer of the n$^+$-type semiconductor region 12b that the conductor part 7d contacts. On the other hand, the other of the n-type semiconductor regions 12 and 12 of the element QR for reading data is shared with one of n-type semiconductor regions 12 for the source and the drain of a selection MIS (Metal Insulator Semiconductor) transistor QS.

The selection MIS transistor QS has a gate electrode FGS, a gate insulating film 10e, and the pair of the n-type semiconductor regions 12 and 12 for the source and the drain. A channel of the selection MIS transistor QS is formed in the upper layer of the p-type well HPW3 where the gate electrode FGS and the active region L3 planarly overlap each other.

The gate electrode FGS includes a conductor film, such as, for example, low-resistance polycrystalline silicon, and is electrically isolated from the floating electrode FG. Further, the silicide layer 5 is formed in part of the surface layer thereof. The silicide layer 5 is formed in part of the surface layer of the conductor film that forms the gate electrode FGS, the conductor film being on the side opposite to the element QR for reading data, not formed in the whole surface layer thereof. The gate electrode FGS is electrically coupled to a conductor part 7f in the contact hole CT formed in the insulating layer 6 over the main surface of the substrate 1S. The contact hole CT should not be illustrated in FIG. 3 as the section taken along X1-X1 Line in FIG. 2, but is illustrated in the view for easy explanation. The conductor part 7f is electrically coupled to a selection line GS.

The gate insulating film 10e includes, for example, silicon oxide, and is formed between the gate electrode FGS and the substrate 1S (p-type well HPW3). The thickness of the gate insulating film 10e is, for example, approximately 12 nm. The configuration of each of a pair of n-type semiconductor regions 12 and 12 of the selection MIS transistor QS is the same as that of each of the n-type semiconductor regions 12 and 12 of the element QR for reading data. The other of the n-type semiconductor regions 12 of the selection MIS transistor QS is electrically coupled to a conductor part 7g in the contact hole CT formed in the insulating layer 6 over the main surface of the substrate 1S. The conductor part 7g is electrically coupled to a bit line RBL for reading data. The silicide layer 5 may be formed in part of the surface layer of the n$^+$-type semiconductor region 12b that the conductor part 7g contacts. However, the silicide layer 5 is not formed in part of the surface layer of the n$^+$-type semiconductor region 12b between the gate electrode FGR of the element QR for reading data and the gate electrode FGS of the selection MIS transistor QS.

The capacitive element C is arranged at a third position where the floating electrode FG planarly overlaps the active region L1 of the p-type well HPW1. The capacitive element C has a control gate electrode CGW, a capacity electrode FGC2, a capacitive insulating film 10c, a p-type semiconductor region 13, an n-type semiconductor region 31, and the p-type well HPW1.

The capacity electrode FGC2 is formed by part of the floating electrodes FG facing the control gate electrode CGW, and is a part that forms one electrode of the capacitive element C. By thus causing the gate of the memory cell MC to have a single layer configuration, the memory cell MC of the non-volatile memory and the elements of the main circuit can be easily matched with each other when they are manufactured, and hence the time or cost for manufacturing the semiconductor device can be reduced.

The length E3 in the second direction X of the capacity electrode FGC2 is formed to be larger than both the length E1 in the second direction X of the capacity electrode FGC1 of the element CWE for writing/erasing data and the length E2 in the second direction X of the gate electrode FGR of the element QR for reading data. That is, in the floating electrode FG, the length E3 in the second direction X of the capacity electrode FGC2 is larger than both the length E1 in the second direction X of the capacity electrode FGC1 and the length E2 in the second direction X of the gate electrode FGR. Thereby, the plane area of the capacity electrode FGC2 can be made large, and hence a coupling ratio can be increased and it becomes possible to improve the efficiency at which a voltage is supplied from control gate wiring CG.

Herein, the floating electrode FG is arranged to extend from one end side of the capacity electrode FGC2 to the capacity electrode FGC1 and the gate electrode FGR, and the plane surface thereof has an approximate flag shape, as illustrated in FIG. 2. Additionally, the gate electrode FGS of the selection MIS transistor QS is arranged on the other side of the capacity electrode FGC2 so as to planarly overlap the active region L3. That is, the plane area of each of the capacity electrode FGC1 and the gate electrode FGR is different from that of the capacity electrode FGC2, and because of that, the gate electrode FGS is arranged in a region that the floating electrode FG does not overlap. On the other hand, if the floating electrode FG is arranged to extend, for example, from the central portion side of the capacity electrode FGC2 to the capacity electrode FGC1 and the gate electrode FGR, and if the plane surface thereof has a T-shape, the gate electrode FGS may be arranged in another region. In First Embodiment, however, the gate electrode FGS is arranged in a region that the floating electrode FG having an approximate flag shape does not overlap, and hence a chip area can be reduced.

The capacitive insulating film 10c includes, for example, silicon oxide, and is formed between the capacity electrode FGC2 and the substrate 1S (p-type well HPW1). The capacitive insulating film 10c is formed simultaneously with the gate insulating films 10b and 10e and the capacitive insulating film 10d by a thermal oxidation process for forming the above last three films, and the thickness of the film 10c is, for example, approximately 12 nm.

A pair of the p-type semiconductor regions 13 and the n-type semiconductor regions 31 of the capacitive element C are formed, in the p-type well HPW1 and at positions by which the capacity electrode FGC2 is sandwiched, self-alignedly with respect to the capacity electrode FGC2. The p-type semiconductor region 13, the n-type semiconductor region 31, and the p-type well HPW1 are parts that form one electrode of the capacitive element C. That is, in the capacitive element C, the conductivity types of the semiconductor regions on both the sides of the capacity electrode FGC2 are asymmetric to each other. With such a configuration, a depletion layer can be suppressed or prevented from being formed in the substrate 1S when data are erased or written.

The p-type semiconductor region 13 has a $p^-$-type semiconductor region 13a located near to a channel and a $p^+$-type semiconductor region 13b electrically coupled to the $p^-$-type semiconductor region 13a. The $p^-$-type semiconductor region 13a and the $p^+$-type semiconductor region 13b contain impurities of the same conductivity type, such as, for example, boron (B), but the impurity concentration of the $p^+$-type semiconductor region 13b is set to be higher than that of the $p^-$-type semiconductor region 13a. The p-type semiconductor region 13 is electrically coupled to the p-type well HPW1.

The n-type semiconductor region 31 has an $n^-$-type semiconductor region 31a located near to a channel and an $n^+$-type semiconductor region 31b electrically coupled to the $n^-$-type semiconductor region 31a. The $n^-$-type semiconductor region 31a and the $n^+$-type semiconductor region 31b contain impurities of the same conductivity type, such as, for example, phosphorus (P) or arsenic (As), but the impurity concentration of the $n^+$-type semiconductor region 31b is set to be higher than that of the $n^-$-type semiconductor region 31a.

The $p^-$-type semiconductor region 13a and the $n^-$-type semiconductor region 31a are terminated after extending by a distance of approximately the width of the sidewall SW from around one end of the capacity electrode FGC2 along the main surface of the substrate 1S. The $p^+$-type semiconductor region 13b and the $n^+$-type semiconductor region 31b partially overlap the $p^-$-type semiconductor region 13a and the $n^-$-type semiconductor region 31a at the terminations thereof, respectively, and are terminated at the isolation part TI after extending by desired lengths from the overlap positions along the main surface of the substrate 1S.

In First Embodiment, the n-type semiconductor region 31 is formed between the two floating electrodes FG adjacent to each other, as illustrated in FIG. 2. That is, the n-type semiconductor region 31 serves as a common region between the two capacitive elements C. The capacitive element C that does not form the memory cell MC is arranged outside the non-volatile memory region, as illustrated. in FIGS. 1 and 2.

The p-type semiconductor region 13 and the n-type semiconductor region 31 are electrically coupled to a conductor part 7e in the contact hole CT formed in the insulating layer 6 over the main surface of the substrate 1S. The conductor part 7e is electrically coupled to the control gate wiring CG. The silicide layer 5 may be formed in part of the surface layers of the $p^+$-type semiconductor region 13b and the $n^+$-type semiconductor region 31b that the conductor part 7e contacts.

As described above, First Embodiment has a configuration in which, of a plurality of the memory cells MC formed in the main surface of the substrate 1S, the elements CWE for writing/erasing data of the respective memory cells MC1 and MC2 arranged to be adjacent to each other are formed in the common active region L2, and the elements QR for reading data of the respective memory cells MC1 and MC2 are formed in the common active region L3.

<<Characteristics of Structure of Non-volatile Memory Cell>>

(1) Structure of Capacity Electrode FGC1 of Element CWE for Writing/Erasing Data In the non-volatile memory cell according to First Embodiment, the floating electrode FG is formed in a state of extending along the first direction Y so as to planarly overlap the p-type wells HPW1, HPW2, and HPW3 that are adjacent to each other, as illustrated in FIGS. 1 and 2. The element CWE for writing/erasing data, which is a capacitive element for writing/erasing data, is arranged at the first position where the floating electrode FG planarly overlaps the active region L2 of the p-type well HPW2, so that the capacity electrode FGC1 is formed by part of the floating electrodes FG. Additionally, the element QR for reading data is arranged at the second position where the floating electrode FG planarly overlaps the active region L3 of the p-type well HPW3, so that the gate electrode FGR is formed by another part of the floating electrode F. Additionally, the capacitive element C is arranged at the third position where the floating electrode FG planarly overlaps the active region L1 of the p-type well HPW1, so that the capacity electrode FGC2 is formed by another part of the floating electrode.

Further, the length E1 in the second direction X of the capacity electrode FGC1 of the element CWE for writing/erasing data is formed to be smaller than the length E2 in the second direction X of the gate electrode FGR of the element QR for reading data, and the length E2 in the second direction X thereof is formed to be smaller than the length E3 in the second direction X of the capacity electrode FGC2 of the capacitive element C.

Traditionally (see, for example, Patent Document 1), the length E1 in the second direction X of the capacity electrode FGC1 of the element CWE for writing/erasing data has been made the same as the length E2 in the second direction X of the gate electrode FGR of the element QR for reading data.

In First Embodiment, however, the length E1 in the second direction X of the capacity electrode FGC1 of the element CWE for writing/erasing data is made smaller than the length E2 in the second direction X of the gate electrode FGR of the element QR for reading data. Because the element CWE for writing/erasing data is used only as a capacitive element, the length E1 in the second direction X of the capacity electrode FGC1 can be reduced. Herein, a side surface of each of the capacity electrode FGC1 of the two elements CWE for writing/erasing data that share the active region L2, the sides surface being on the side opposite to the side surface where the capacity electrode FGC1 faces the other capacity electrode FGC1, is recessed in plan view. In other words, the side surface is caused to have a concave shape in plan view. Thereby, the length in the second direction X of the active region L2 where the element CWE for writing/erasing data is arranged can be reduced. However, it is not excluded that both the side surfaces of the capacity electrode FGC1 of the element CWE for writing/ erasing data may have a concave shape in plan view.

Additionally, the space (isolation width) between the active regions L2, which are adjacent to each other in the second direction X, can also be reduced. However, a high voltage is applied to the embedded well DNW between the active regions L2 adjacent to each other in the second direction X, which leads to a decrease in a withstand voltage if the space is reduced, and hence it is not preferable to reduce the above isolation width. In the non-volatile memory cell according to First Embodiment, however, the length E1 in the second direction X of the active region L2 where the element CWE for writing/erasing data is arranged is reduced, and hence it becomes possible to reduce a cell size in the second direction X while the aforementioned isolation width is being maintained. Additionally, it is not necessary to reduce not only the space between the active regions L2 adjacent to each other in the second direction X, but also the space between the active regions adjacent to each other in the first direction Y (space (isolation width) illustrated by the bold arrow in FIG. 1), and hence a high withstand voltage characteristic can be held as the whole non-volatile memory.

The smallest length E1 in the second direction X of the capacity electrode FGC1 of the element CWE for writing/ erasing data is determined, for example, by a mask alignment margin needed when the p$^-$-type semiconductor region 15$a$ and the n$^-$-type semiconductor region 30$a$ are formed on both the sides of the capacity electrode FGC1. That is, the size needed for the mask alignment for securely forming the p$^-$-type semiconductor region 15$a$ and the n$^-$-type semiconductor region 30$a$ on both the sides of the capacity electrode FGC1, respectively, is required of the length E1 in the second direction X of the capacity electrode FGC1 of the element CWE for writing/erasing data.

(2) Reduction in Area of Capacity Electrode FGC2 of Capacitive Element C

As described in the aforementioned (1), the capacitance area of the element CWE for writing/erasing data is reduced by reducing the length E1 in the second direction X of the capacity electrode FGC1 of the element CWE for writing/ erasing data. Thereby, the capacitance area of the capacitive element C (plane area of the capacity electrode FGC2), required in order to maintain a coupling ratio, at which data is written and erased, at a constant value, can be reduced. Accordingly, both a length E4 in the first direction Y and the length E3 in the second direction X of the capacity electrode FGC2 of the capacitive element C can be reduced, and hence it becomes possible to reduce the cell sizes in the first direction Y and in the second direction X.

(3) Reduction in Space between Element QR for Reading Data and Selection MIS Transistor QS As described in the aforementioned (1) and (2), the cell size in the second direction X can be reduced by reducing both the length E1 in the second direction X of the capacity electrode FGC1 of the element CWE for writing/erasing data and the length E3 in the second direction X of the capacity electrode FGC2 of the capacitive element C. In this case, the space between the element QR for reading data and the selection MIS transistor QS is also reduced, with a reduction in the cell size in the second direction X.

In order to lower the resistance, it is desirable to form the silicide layer 5 over the gate electrode FGS of the selection MIS transistor QS. However, misalignment may be generated in the step of forming the silicide layer 5 when the space between the element QR for reading data and the selection MIS transistor QS is reduced, and hence a state where the silicide layer 5 is formed in the surface layer of the n-type semiconductor region 12 between the gate electrode FGR of the element QR for reading data and the gate electrode FGS of the selection MIS transistor QS, or a state where the silicide layer 5 is not formed therein, is created. Thereby, a variation is generated in the read-out current of the memory cell due to the presence/absence of the silicide layer 5. Additionally, if the silicide layer 5 is formed over the floating electrode FG (the gate electrode FGR and the capacity electrodes FGC1, FGC2), a charge stored in the floating electrode FG flows out to the substrate 1S through the silicide layer 5. Thereby, the failure that data in the memory cannot be held may be generated.

Accordingly, the silicide layer 5 is formed only in the surface layer of the gate electrode FGS of the selection MIS transistor QS, not being formed in the surface layer of the n-type semiconductor region 12 between the gate electrode FGR of the element QR for reading data and the gate electrode FGS of the selection MIS transistor QS. Further, in order that the silicide layer 5 is not formed over the floating electrode FG (the gate electrode FGR and the capacity electrodes FGC1, FGC2), the silicide layer 5 is formed only in part of the surface layer of the gate electrode FGS on the side opposite to the element QR for reading data, in consideration of misalignment in the step of forming the silicide layer 5, etc. Thereby, a variation in the read-out current of the memory cell can be prevented, and further loss of the charges from the floating electrode FG can be prevented.

(4) Conclusion

According to First Embodiment, the length E1 in the second direction X of the capacity electrode FGC1 of the element CWE for writing/erasing data (length in the second direction X of the active region L2) and both the length E4 in the first direction Y and the length E3 in the second direction X of the capacity electrode FGC2 of the capacitive element C can be reduced, without reducing the space (isolation width) between the active regions L1, L2, L3, and L4 adjacent to each other, as described above. Thereby, the cell sizes in the first direction Y and in the second direction X can be reduced, while a high withstand voltage characteristic is being held. Further, the chip area can also be reduced by reducing the non-volatile memory region.

Additionally, a variation in the read-out current of the memory cell and loss of the charges from the floating electrode FG can be prevented by forming the silicide layer 5 in part of the surface layer of the gate electrode FGS of the selection MIS transistor QS, the gate electrode FGS being on the side opposite to the element QR for reading date, and hence a decrease in reliability, which may be generated by a reduction in the non-volatile memory cell, can also be suppressed.

<<Operation of Non-volatile Memory>>

Figure 4:
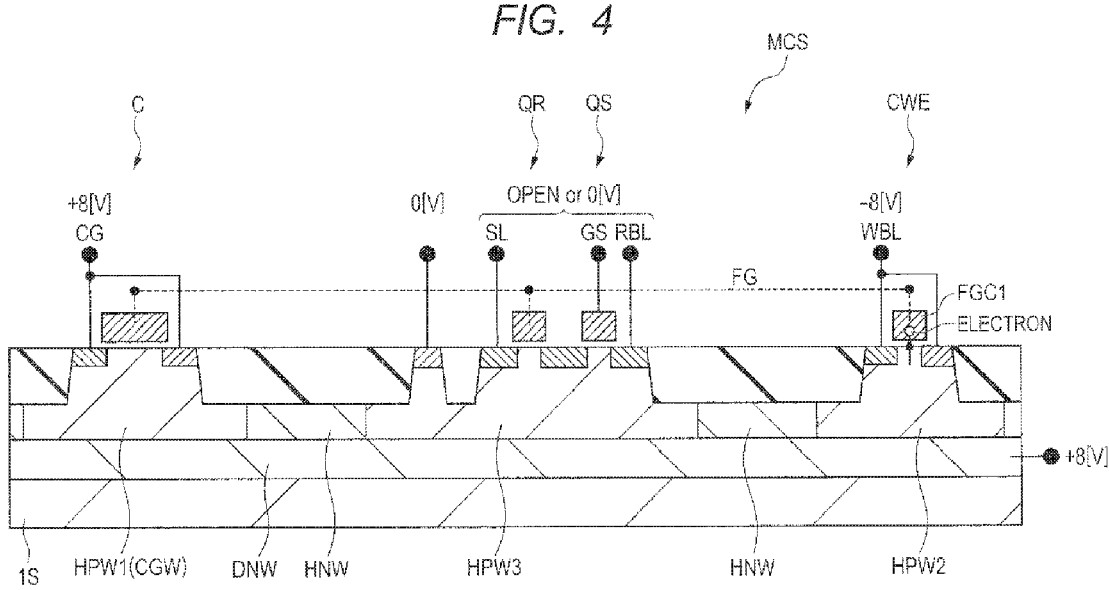
FIG. 4 is a view for explaining a data writing operation in a non-volatile memory according to First Embodiment of the invention.
Figure 5:
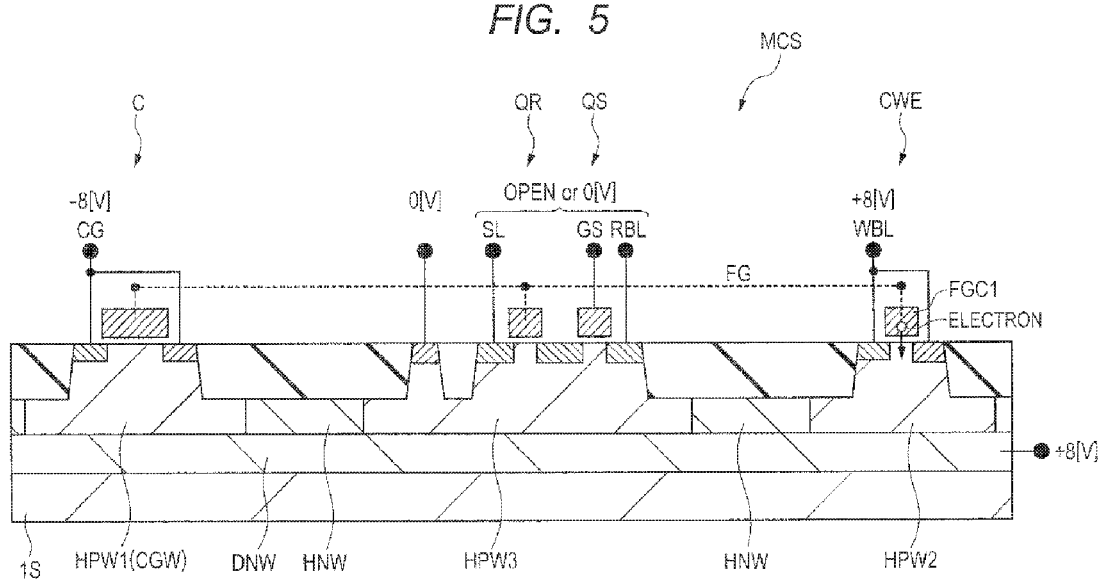
FIG. 5 is a view for explaining a data erasing operation in the non-volatile memory according to First Embodiment of the invention.
Figure 6:
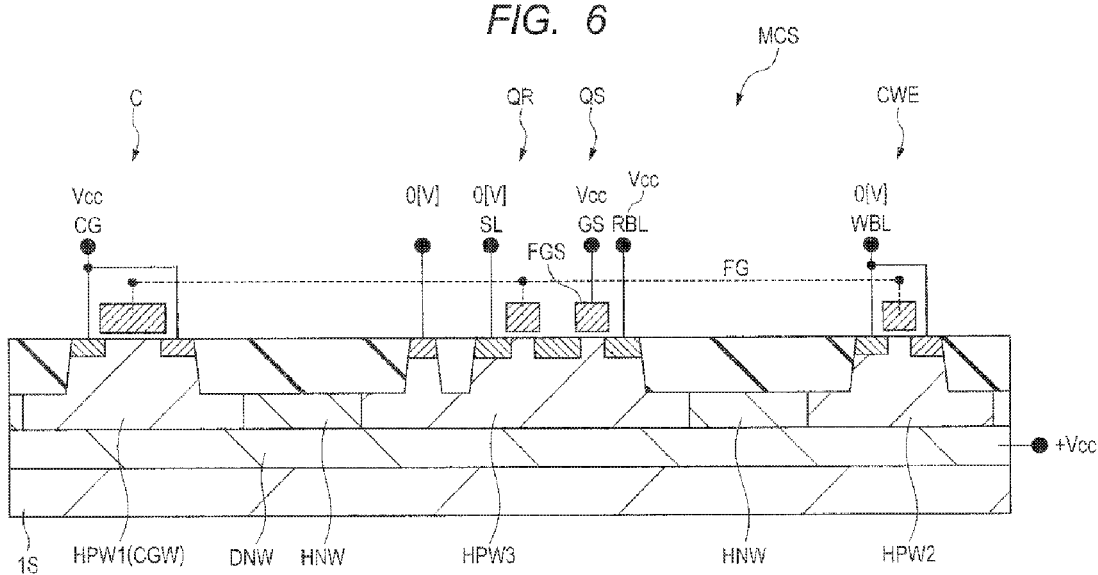
FIG. 6 is a view for explaining a data reading operation in the non-volatile memory according to First Embodiment of the invention.

Subsequently, examples of the operation of the non-volatile memory according to First Embodiment will be described with reference to FIGS. 4 to 6. In the following description, the memory cell MC into which data is to be written is referred to as a selected memory cell MCS.

(Data Writing Operation)

An example of a data writing operation will be described with reference to FIG. 4. FIG. 4 is a view for explaining a data writing operation in the non-volatile memory according to First Embodiment. Herein, injection of an electron into a floating electrode is defined as data writing, but conversely extraction of an electron in a floating electrode can also be defined as data writing.

When data is written, a positive control voltage of, for example, +8 V is applied to the control gate wiring CG to which the other electrode of the capacitive element C of the selected memory cell MCS is coupled. A voltage of, for example, 0 V is applied to other control gate wiring CG. Additionally, a negative voltage of, for example, −8 V is applied to the bit line WBL for writing/erasing data to which one electrode of the element CWE for writing/erasing data of the selected memory cell MCS is electrically coupled. A voltage of, for example, 0 V is applied to other bit lines WBL for writing/erasing data. Additionally, for example, 0 V (or OPEN) is applied to the selection line GS, the source line SL, and a bit line RBL for writing data.

Thereby, an electron is injected into the floating electrode FG of the element CWE for writing/erasing data of the selected memory cell MCS by an FN (Fowler-Nordheim) tunnel current over the whole channel surface, allowing data to be written.

Thus, data writing in First Embodiment is performed by generating the FN tunnel current with a potential difference of 16 V, the potential difference being generated by: applying the control voltage of +8 V to the control gate wiring CG to cause the voltage of the p-type well HPW1 of the capacitive element C to be +8 V; and applying a voltage of −8 V to the bit line WBL to cause the voltage of the p-type well HPW2 of the element CWE for writing/erasing data to be −8 V.

Thereby, data is written by injecting an electron in the p-type well HPW2 of the element CWE for writing/erasing data of the selected memory cell MCS into the capacity electrode FGC1 (floating electrode FG) through a capacitive insulating film with the use of the FN tunnel current over the whole channel surface.

(Data Erasing Operation)

Examples of a data bit unit erasing operation and a collective data erasing operation will be described with reference to FIG. 5. FIG. 5 is a view for explaining a data erasing operation in the non-volatile memory according to First Embodiment. Herein, extraction of an electron in a floating electrode is defined as data erasing, but conversely injection of an electron into a floating electrode can also be defined as data erasing.

(1) Example of Data Bit Unit Erasing Operation

In erasing a data bit unit, a negative control voltage of, for example, −8 V is applied to the control gate wiring CG to which the other electrode of the capacitive element C of the selected memory cell MCS is coupled. A voltage of, for example, 0 V is applied to other control gate wiring CG. A positive voltage of, for example, +8 V is applied to the bit line WBL for writing/erasing data to which one electrode of the element CWE for writing/erasing data of the selected memory cell MCS is electrically coupled. A voltage of, for example, 0 V is applied to the other bit lines WBL for writing/erasing data. Additionally, for example, 0 V (or OPEN) is applied to the selection line GS, the source line SL, and the bit line RBL for writing data.

Thereby, an electron stored in the floating electrode FG of the element CWE for writing/erasing data of the selected memory cell MCS whose data is to be erased, is discharged by the FN tunnel current over the whole channel surface, allowing the data in the selected memory cell MCS whose data is to be erased, to be erased.

(2) Example of Collective Data Erasing Operation

In collectively erasing data, a negative control voltage of, for example, −8 V is applied to the control gate wiring CG to which the other electrode of the capacitive element C of each of the memory cells MC is coupled. Additionally, a positive voltage of, for example, +8 V is applied to the bit line WBL for writing/erasing data to which one electrode of the element CWE for writing/erasing data of each of the memory cells MC is electrically coupled. Additionally, for example, 0 V (or OPEN) is applied to the selection line GS, the source line SL, and the bit line RBL for writing data. Thereby, an electron stored in the floating electrode FG of the element CWE for writing/erasing data of the memory cells MC that collectively erase data is discharged by the FN tunnel current over the whole channel surface, allowing the data in the memory cells MC to be collectively erased.

Thereby, an electron stored in the capacity electrode FGC1 of the element CWE for writing/erasing data (floating electrode FG) of the selected memory cell MCS or the memory cells MC is discharged, by the FN tunnel current over the whole channel surface, to the p-type well HPW2 through the capacitive insulating film, allowing data to be erased.

(Data Reading Operation)

An example of a data reading operation will be described with reference to FIG. 6. FIG. 6 is a view for explaining a data reading operation in the non-volatile memory according to First Embodiment.

In reading data, a desired control voltage of, for example, a Vcc electrode is applied to the control gate wiring CG to which the other electrode of the capacitive element C of the selected memory cell MCS is coupled. A voltage of, for example, 0 V is applied to other control gate wiring CG. Additionally, a voltage of, for example, 0 V is applied to the bit line WBL for writing/erasing data to which one electrode of the element CWE for writing/erasing data of the selected memory cell MCS is electrically coupled. Additionally, a desired voltage of, for example, a Vcc power supply is applied to both the selection line GS to which the gate electrode FGS of the selection MIS transistor QS of the selected memory cell MCS is electrically coupled, and the bit lone RBL for writing data, for example; and for example, 0 V is applied to the source line SL.

Thereby, the element QR for reading data of the selected memory cell MCS whose data is to be read is caused to be in an ON condition, so that it is read, by whether a drain current flows through the channel of the element QR for reading the data, that the data stored in the selected memory cell MCS is either of 0 and 1.

According to First Embodiment, the element CWE for writing/erasing data, the element QR for reading data, and the capacitive element C are formed in the separate p-type wells HPW1, HPW2, and HPW3, respectively, and each of them is isolated by the n-type well HNW and the n-type embedded well DNW, as described above. And data rewriting is performed by the capacitive element C. Thereby, the potentials of the p-type semiconductor region 15 (see FIG. 2 or FIG. 3) and the p-type well HPW2 become equal to each other in rewriting data by the FN tunnel current over the whole channel surface, and hence there is no problem with respect to a junction withstand voltage. As a result, degradation of the memory cell MC of the non-volatile memory can be suppressed or prevented, thereby allowing the operational reliability of the non-volatile memory to be improved.

Additionally, data rewriting can be performed by the FN tunnel current over the whole channel surface, the FN tunnel current having the smallest consumed current and being suitable for single power supply rewriting at a low voltage, and hence data rewriting can be easily performed by a single power supply using an internal booster circuit. Further, an FN tunnel current in which a hole is not generated is used in writing and erasing data, and hence the number of times of rewriting data can be increased.

Furthermore, the element CWE for writing/erasing data and the element QR for reading data are formed in the separate p-type wells HPW2 and HPW3, respectively, and hence data rewriting can be stabilized. Thereby, the operational reliability of the non-volatile memory can be improved.

<<Manufacturing Method of Non-volatile Memory>>

Subsequently, an example of a manufacturing method of the semiconductor device according to First Embodiment, in which a non-volatile memory for storing desired information on a main circuit is formed in a semiconductor chip where an LCD driver circuit is formed as the main circuit, will be described with reference to FIGS. 7 to 12. FIGS. 7 to 12 are essential-part sectional views of the non-volatile memory region (section taken along X1-X1 Line in FIG. 2) during manufacturing steps of the semiconductor device according to First Embodiment, and herein a manufacturing method of a non-volatile memory cell will only be described. In FIGS. 7 to 12, a region for forming the capacitive element C is denoted by a capacity part, a region for forming the element CWE for writing/erasing data by a writing/erasing part, a region for forming the element QR for reading data by a reading part, and a region for forming the selection MIS transistor by a selection part.

Figure 7:
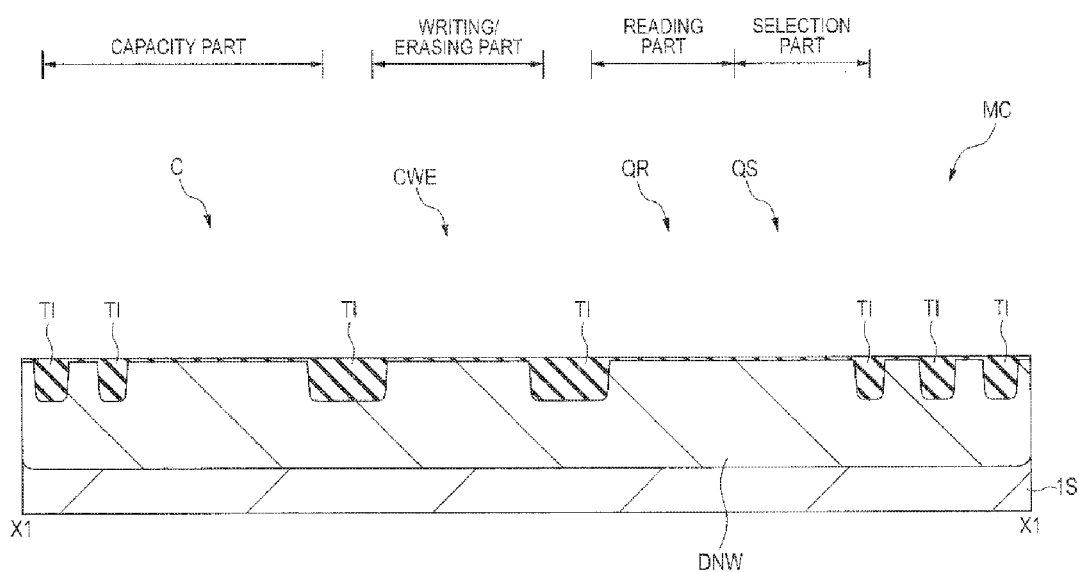
FIG. 7 is an essential-part sectional view of the non-volatile memory region (section taken along X1-X1 Line in FIG. 2) during a manufacturing step of the semiconductor device according to First Embodiment of the invention.

As illustrated in FIG. 7, the p-type substrate 1S (semiconductor wafer) is first provided, so that the n-type embedded well DNW is formed in the non-volatile memory region by an ion implantation process, or the like. Thereafter, an isolation trench is formed in the isolation region of the main surface of the substrate 1S, and then an isolation trench TI having a trench shape is formed by embedding an insulating film in the isolation trench. Thereby, an active region is defined.

Figure 8:
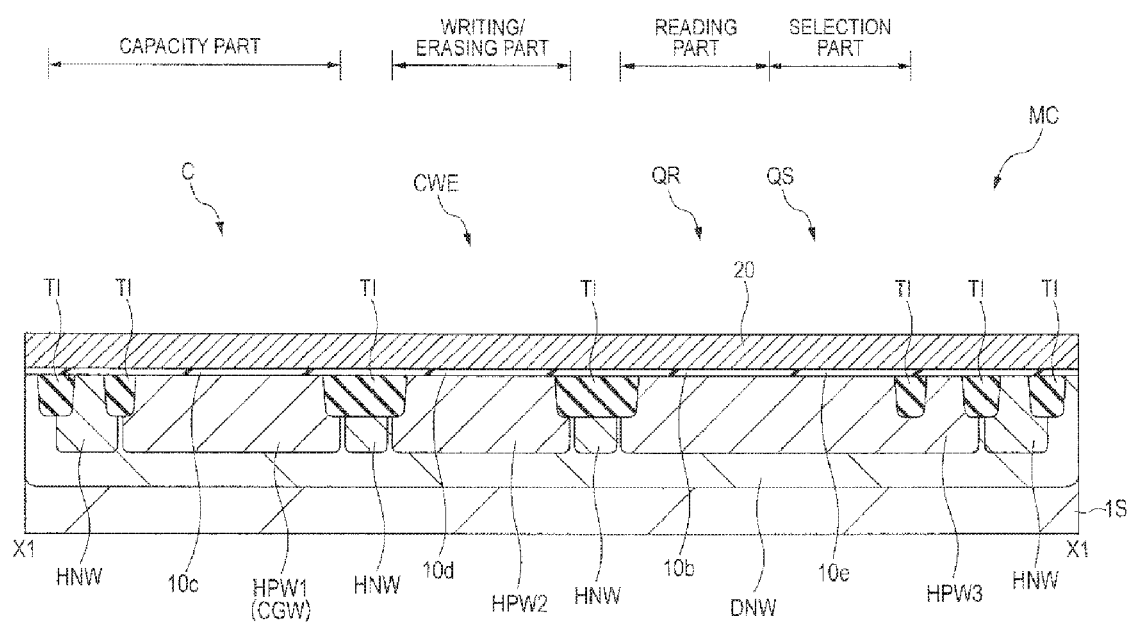
FIG. 8 is an essential-part sectional view of the same place as in FIG. 7 during a manufacturing step of the semiconductor device, following FIG. 7.

Subsequently, the p-type wells HPW1, HPW2, and HPW3 and the n-type well HNW are formed by a lithography process and an ion implantation process, etc., as illustrated in FIG. 8. Then, after the gate insulating films 10$b$ and 10$e$ and the capacitive insulating films 10$c$ and 10$d$ are formed by a thermal oxidation process, or the like, a conductor film 20 including, for example, low-resistance polycrystalline silicon is formed over the main surface of the substrate 1S (semiconductor wafer) by a CVD (Chemical Vapor Deposition) process, or the like.

Figure 9:
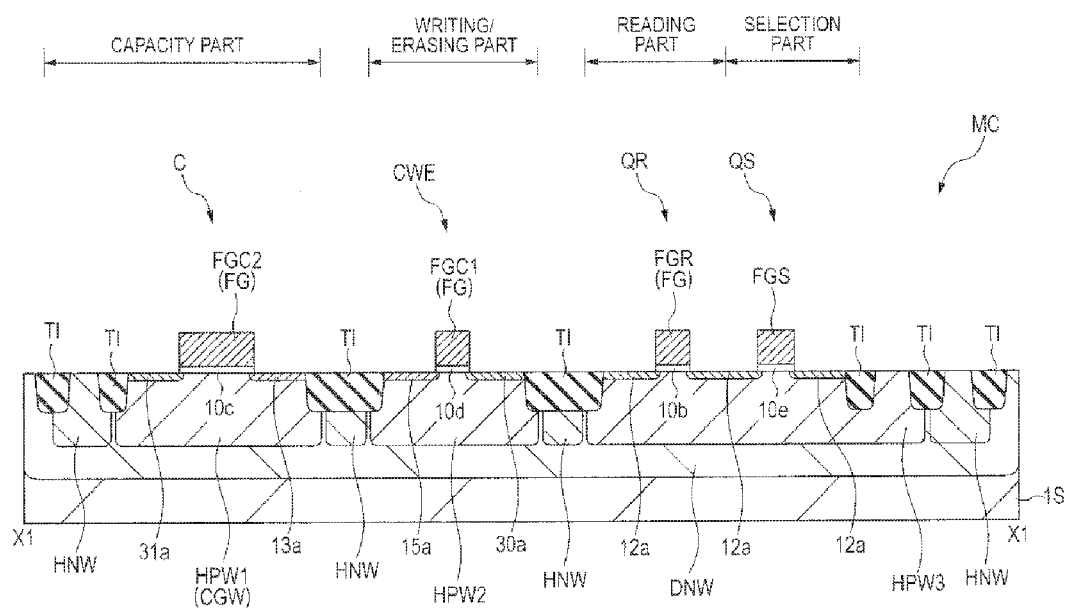
FIG. 9 is an essential-part sectional view of the same place as in FIG. 7 during a manufacturing step of the semiconductor device, following FIG. 8.

Subsequently, the gate electrode FGS and the floating electrode FG (the gate electrode FGR and the capacity electrodes FGC1, FGC2) are simultaneously formed by patterning the conductor film 20 with the use of a lithography process and an etching step, as illustrated in FIG. 9.

Figure 10:
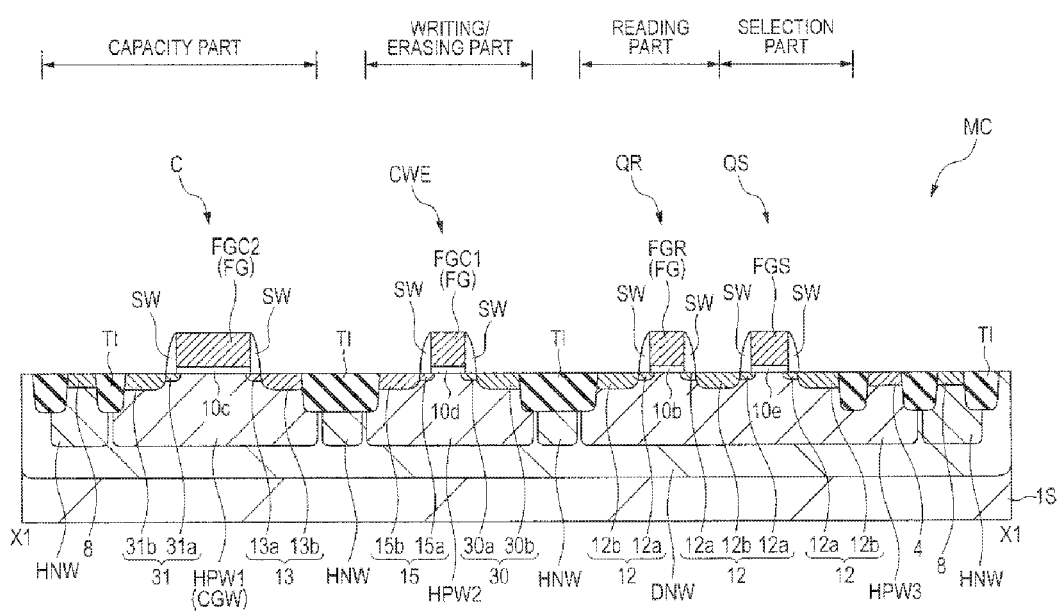
FIG. 10 is an essential-part sectional view of the same place as in FIG. 7 during a manufacturing step of the semiconductor device, following FIG. 9.

Then, the p$^-$-type semiconductor regions 13$a$ and 15$a$ are simultaneously formed in the capacity part and the writing/erasing part by a lithography process and an ion implantation process, etc. Then, the n$^-$-type semiconductor regions 12$a$, 30$a$, and 31$a$ are simultaneously formed in the capacity part, the writing/erasing part, the reading part, and the selection part by a lithography process and an ion implantation process, etc.

subsequently, after an insulating film including, for example, silicon oxide is deposited over the main surface of the substrate 1S (semiconductor wafer) by a CVD process, or the like, the sidewall SW is formed over the side surfaces of the gate electrode FGS and the floating electrode FG (the gate electrode FGR and the capacity electrodes FGC1, FGC2) by performing etchback on the insulating film with the use of anisotropic dry etching, as illustrated in FIG. 10.

Then, the p$^+$-type semiconductor regions 13$b$, 15$b$, and 4 are simultaneously formed in the extraction regions of the capacity part, the writing/erasing part, and the p-type well HPW3 by a lithography process and an ion implantation process, etc. Thereby, the p-type semiconductor region 13 including the p$^-$-type semiconductor region 13$a$ and the p$^+$-type semiconductor region 13$ba$ is formed in the capacity part. Additionally, the p-type semiconductor region 15 including the p$^-$-type semiconductor region 15$a$ and the p$^+$-type semiconductor region 15$b$ is formed in the writing/erasing part.

Then, the n$^+$-type semiconductor regions 31$b$, 30$b$, and 12$b$ are simultaneously formed in the capacity part, the writing/erasing part, the reading part, and the selection part by a lithography process and an ion implantation process, etc. Thereby, the n-type semiconductor region 31 including the n$^-$-type semiconductor region 31$a$ and the n$^+$-type semiconductor region 31$b$ is formed in the capacity part, so that the capacitive element C is formed. Additionally, the n-type semiconductor region 30 including the n$^-$-type semiconductor region 30$a$ and the n$^+$-type semiconductor region 30$b$ is formed in the writing/erasing part, so that the element CWE for writing/erasing data is formed. Additionally, the n-type semiconductor region 12 including the n$^-$-type semiconductor region 12$a$ and the n$^+$-type semiconductor region 12$b$ is formed in the reading part and the selection part, so that the element QR for reading data and the selection MIS transistor QS are formed.

Figure 11:
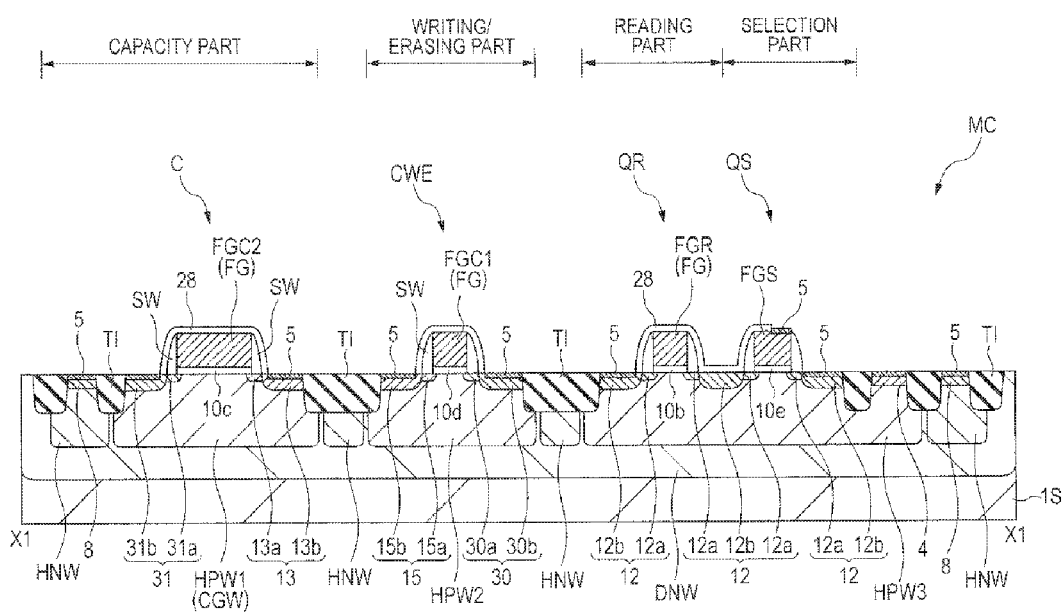
FIG. 11 is an essential-part sectional view of the same place as in FIG. 7 during a manufacturing step of the semiconductor device, following FIG. 10.

Subsequently, the silicide layer 5 is selectively formed: in the surface layers of all of the p$^+$-type semiconductor regions 13$b$ and 15$b$, the n$^+$-type semiconductor regions 30$b$ and 31$b$, the n$^+$-type semiconductor region 12$b$ except the space between the selection MIS transistor QS and the element QR for reading data, and the p$^-$-type semiconductor region 4; and in part of the surface layer of the gate electrode FGS of the selection MIS transistor QS, the gate electrode FGS being on the side opposite to the element OR for reading data, as illustrated in FIG. 11.

Before the process for forming the silicide layer 5, it is made that the silicide layer 5 should not be formed in the upper surface of the floating electrode FG (the gate electrode FGR and the capacity electrodes FGC1, FGC2), by forming an insulating film 28 there. That is, a structure is adopted, in which the silicide layer 5 is formed over the gate electrode FGS of the selection MIS transistor QS in the selection part but is not formed over the floating electrode FG (the gate electrode FGR and the capacity electrodes FGC1, FGC2) in the capacity part, the writing/erasing part, and the reading part. Herein, the insulating film 28 includes, for example, silicon oxide.

The silicide layer 5 should not be formed over the floating electrode FG (the gate electrode FGR and the capacity electrodes FGC1, FGC2) because of the following reason. That is, in order to form a self-aligned contact, the insulating layer 6a (see FIG. 12) including silicon nitride is formed to cover the floating electrode FG in a later step. This film is generally formed by a plasma CVD process in order to perform the process at a low temperature, but the film may slightly have conductivity, depending on a gas flow rate ratio or the start-up situation of plasma when the film is formed. In this case, a charge stored in the floating electrode FG flows out to the substrate 1S through the insulating layer 6a including silicon nitride. Accordingly, a failure may be generated, in which the data in the memory cannot be held. So, the insulating film 28 is formed to cover the floating electrode FG, in order to solve the above problem.

On the other hand, it is desirable to form the silicide layer 5 over the gate electrode FGS of the selection MIS transistor QS in order to lower the resistance. However, if the alignment margin between the end of the insulating film 28 and the gate electrode FGS of the selection MIS transistor QS is small, the case where the end of the insulating film 28 is located between the gate electrode FGR of the element QR for reading data and the gate electrode FGS of the selection MIS transistor QS, or the case where the end thereof is not located between them, is generated. Accordingly, a situation in which the silicide layer 5 is formed in all of the surface layer of the n-type semiconductor region 12 between the gate electrode FGR of the element QR for reading data and the gate electrode FGS of the selection MIS transistor QS; a situation in which the silicide layer 5 is formed in part of the surface layer thereof; or a situation in which the silicide layer 5 is never formed in all of the surface layer thereof, is generated, and hence a variation is generated in the read-out current. Additionally, if the end of the insulating film 28 is located over the floating electrode FG (the gate electrode FGR and the capacity electrodes FGC1, FGC2), a charge stored in the floating electrode FG flows out to the substrate 1S through the silicide layer 5. Accordingly, a failure may be generated, in which the data in the memory cannot be held. So, in order to solve the above problem, the insulating film 28 is formed such that the whole surface layer of the n-type semiconductor region 12 between the gate electrode FGR of the element QR for reading data and the gate electrode FGS of the selection MIS transistor QS is covered, and such that the end of the insulating film 28 is located over the gate electrode FGS of the selection MIS transistor QS.

Further, each of the p⁻-type semiconductor regions 13a and 15a and the n⁻-type semiconductor regions 30a and 31a is a region having a very small junction depth, and hence the silicide layer 5 may reach the substrate 1S by extending beyond the p⁻-type semiconductor regions 13a and 15a and n⁻-type semiconductor regions 30a and 31a. That is, if the insulating film 28 is not formed, a structure is formed, in which a leakage current may easily flow from the end of the silicide layer 5 toward the substrate 1S below the p⁻-type semiconductor regions 13a and 15a and the n⁻-type semiconductor regions 30a and 31a. So, in order to solve the above problem, a structure is adopted, in which the silicide layer 5 is made away from the p⁻-type semiconductor regions 13a and 15a and the n⁻-type semiconductor regions 30a and 31a by forming the insulating film 28.

By forming the insulating film 28 such that the end thereof is thus located over the gate electrode FGS of the selection MIS transistor QS, the silicide layer 5 is formed in part of the surface layer of the gate electrode FGS on the side opposite to the element QR for reading data.

Figure 12:
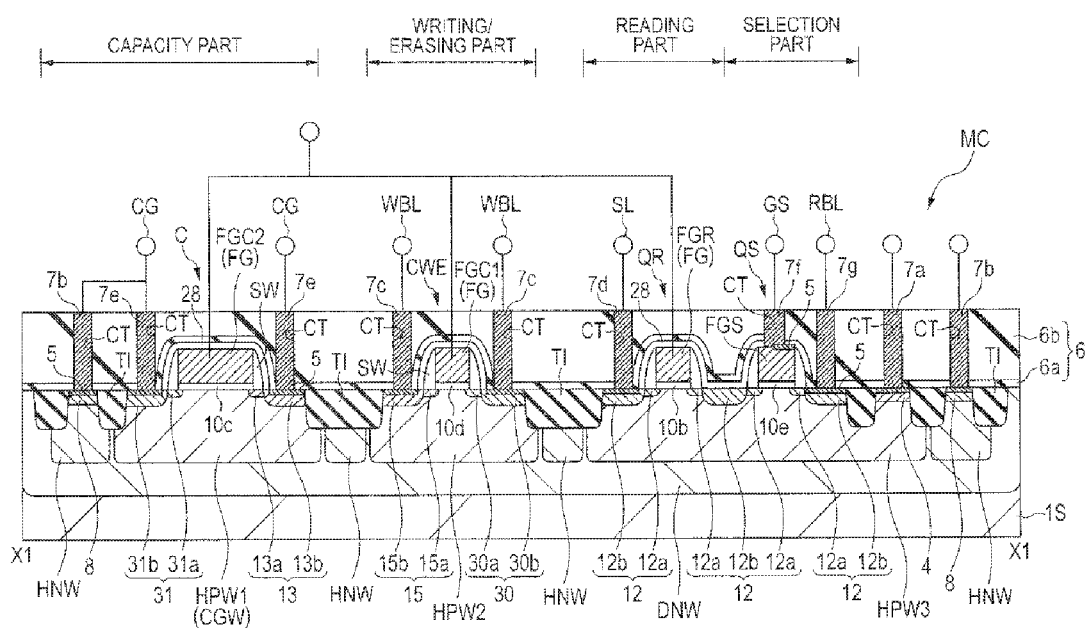
FIG. 12 is an essential-part sectional view of the same place as in FIG. 7 during a manufacturing step of the semiconductor device, following FIG. 11.

Subsequently, after the insulating layer 6a including, for example, silicon nitride is deposited over the main surface of the substrate 1S (semiconductor wafer) by a CVD process, or the like, the insulating film 6b including, for example, silicon oxide is deposited thereover so as to have a thickness larger than that of the insulating layer 6a by a CVD process, or the like, as illustrated in FIG. 12. Further, the upper surface of the insulating layer 6b is flattened by a CMP (Chemical Mechanical Polishing) process, or the like. Then, the contact hole CT is formed in the insulating layer 6 by a lithography process and an etching process. Thereafter, a conductor film including, for example, tungsten (W), etc., is deposited over the main surface of the substrate 1S (semiconductor wafer) by a CVD process, or the like, and then the conductor parts 7a, 7b, 7c, 7d, 7e, 7f, and 7g are formed in the contact holes CT by polishing the conductor film with the use of a CMP process, or the like. Thereafter, the semiconductor device is manufactured through usual steps of forming wiring, inspection, and assembly.

According to First Embodiment, the cell sizes in the first direction Y and in the second direction X of a non-volatile memory cell can be thus reduced, respectively, and hence the chip area of a semiconductor device having a non-volatile memory can be reduced.

(Second Embodiment)

In a semiconductor device according to Second Embodiment of the present invention, a main circuit and a non-volatile memory for storing relatively small and desired data (information) on the main circuit are formed in each of a main circuit region and a non-volatile memory region that are arranged in the same semiconductor chip, similarly to First Embodiment.

Figure 13:
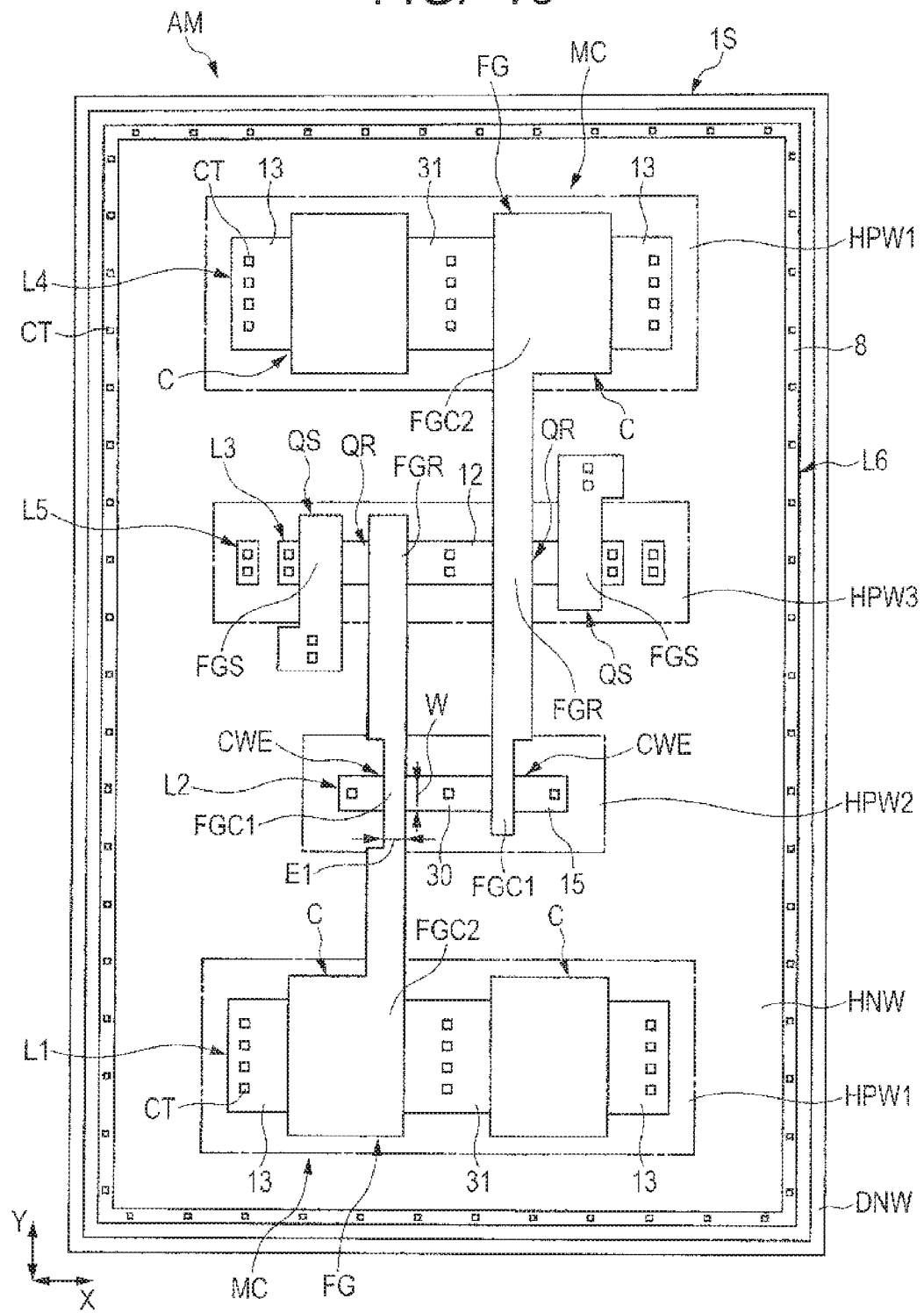
FIG. 13 is an essential-part plan view of a non-volatile memory (in the case of 2 bits) arranged in a non-volatile memory region according to Second Embodiment of the invention.

FIG. 13 is an essential-part plan view of a non-volatile memory arranged in a non-volatile memory region of a substrate 1S according to Second Embodiment, which illustrates the case of 2 bits. Hereinafter, the points different from the non-volatile memory according to First Embodiment will only be described.

As illustrated in FIG. 13, a non-volatile memory cell MC according to Second Embodiment is characterized in that a length (gate length) E1 in a second direction X of a capacity electrode FGC1 of an element CWE for writing/erasing data is smaller than a length (gate width) W in a first direction Y of the capacity electrode FGC1 of the element CWE for writing/erasing data.

By causing the shape of the capacity electrode FGC1 of the element CWE for writing/erasing data to be the aforementioned shape, the size in the second direction X of the non-volatile memory cell MC can be further reduced. In this case, a length W in the first direction Y is enlarged, and hence a capacitance area almost the same as that in First Embodiment can be obtained. Additionally, by causing the shape of the capacity electrode FGC1 of the element CWE for writing/erasing data to be the aforementioned shape, the speed of writing (injection of an electron into the capacity electrode FGC1) becomes smaller and the speed of erasing (injection of a hole into the capacity electrode FGC1) becomes larger than those in the non-volatile memory cell MC according to First Embodiment, respectively, and hence it becomes possible to adjust data writing/erasing characteristics.

The invention made by the present inventors has been specifically described above based on preferred embodiments, but the invention should not be limited to the preferred embodiments, and it is needless to say that various modifications may be made to the invention within a range not departing from the gist of the invention.

A semiconductor device, having both a main circuit formed by using, for example, a single layer polycrystalline silicon gate and a non-volatile memory, can be applied to a logical device, an analog device, an RF device, or the like.

What is claimed is:

1. A semiconductor device comprising:
a first non-volatile memory cell including a first element for writing/erasing data, a first element for reading data, and a first capacitive element, which are formed in a main surface of a semiconductor substrate;
a second non-volatile memory cell including a second element for writing/erasing data, a second element for reading data, and a second capacitive element, which are formed in the main surface; and
a first active region, a second active region, a third active region, and a fourth active region, which are arranged in the main surface and along a first direction so as to be isolated from each other,
wherein the first capacitive element of the first non-volatile memory cell is formed in the first active region, and
wherein both the first element for writing/erasing data of the first non-volatile memory cell and the second element for writing/erasing data of the second non-volatile memory cell are formed in the second active region, and
wherein both the first element for reading data of the first non-volatile memory cell and the second element for reading data of the second non-volatile memory cell are formed in the third active region, and
wherein the second capacitive element of the second non-volatile memory cell is formed in the fourth active region, and
wherein the first non-volatile memory cell has a first floating electrode that is arranged to extend in the first direction and to planarly overlap the first active region, the second active region, and the third active region, and that functions as an electrode of each of the first element for writing/erasing data, the first element for reading data, and the first capacitive element, and
wherein the second non-volatile memory cell has a second floating electrode that is arranged to extend in the first direction and to planarly overlap the second active region, the third active region, and the fourth active region, and that functions as an electrode of each of the second element for writing/erasing data, the second element for reading data, and the second capacitive element, and
wherein, in the first non-volatile memory cell, a length in a second direction of the first floating electrode that planarly overlaps the second active region, the second direction intersecting with the first direction at right angles and over the main surface, is different from a length in the second direction of the first floating electrode that planarly overlaps the third active region, and
wherein, in the second non-volatile memory cell, a length in the second direction of the second floating electrode that planarly overlaps the second active region is different from a length in the second direction of the second floating electrode that planarly overlaps the third active region.

2. The semiconductor device according to claim 1,
wherein, in the first non-volatile memory cell, the length in the second direction of the first floating electrode that planarly overlaps the second active region is smaller than the length in the second direction of the first floating electrode that planarly overlaps the third active region, and
wherein, in the second non-volatile memory cell, the length in the second direction of the second floating electrode that planarly overlaps the second active region is smaller than the length in the second direction of the second floating electrode that planarly overlaps the third active region.

3. The semiconductor device according to claim 1,
wherein, in the first non-volatile memory cell, the length in the second direction of the first floating electrode that planarly overlaps the first active region is larger than the length in the second direction of the first floating electrode that planarly overlaps the third active region, and
wherein, in the second non-volatile memory cell, the length in the second direction of the second floating electrode that planarly overlaps the fourth active region is larger than the length in the second direction of the second floating electrode that planarly overlaps the third active region.

4. The semiconductor device according to claim 1,
wherein, in the first floating electrode that planarly overlaps the second active region, a side surface on a side opposite to the second floating electrode is recessed in plan view, and
wherein, in the second floating electrode that planarly overlaps the second active region, a side surface on a side opposite to the first floating electrode is recessed in plan view.

5. The semiconductor device according to claim 1,
wherein, in the first non-volatile memory cell, the length in the second direction of the first floating electrode that planarly overlaps the second active region is smaller than a length in the first direction of the first floating electrode that planarly overlaps the second active region, and
wherein, in the second non-volatile memory cell, the length in the second direction of the second floating electrode that planarly overlaps the second active region is smaller than a length in the first direction of the second floating electrode that planarly overlaps the second active region.

6. The semiconductor device according to claim 1,
wherein the first non-volatile memory cell further includes a first selection element, and
wherein the second non-volatile memory cell further includes a second selection element, and
wherein a first electrode of the first selection element is arranged at a position that planarly overlaps the third active region so as to be spaced apart from the first floating electrode and to be located on a side opposite to the second floating electrode, and
wherein a second electrode of the second selection element is arranged at a position that planarly overlaps the third active region so as to be spaced apart from the second floating electrode and to be located on a side opposite to the first floating electrode, and
wherein a silicide layer is formed in part of a surface layer of the first electrode and in part of a surface layer of the second electrode, and wherein a silicide layer is not formed in a surface layer of the third active region between the first floating electrode and the second floating electrode.

7. The semiconductor device according to claim 6,
wherein a silicide layer is not formed in surface layers of the first floating electrode and the second floating electrode.

8. The semiconductor device according to claim 7,
wherein each of the first floating electrode and the second floating electrode includes polycrystalline silicon.

9. The semiconductor device according to claim 1,
wherein data rewriting in both the first element for writing/erasing data and the second element for writing/erasing data is performed by an FN tunnel current.

* * * * *